United States Patent
Tsai et al.

(10) Patent No.: US 8,946,849 B2
(45) Date of Patent: Feb. 3, 2015

(54) BSI IMAGE SENSOR CHIPS WITH SEPARATED COLOR FILTERS AND METHODS FOR FORMING THE SAME

(75) Inventors: Shuang-Ji Tsai, Tainan (TW); Dun-Nian Yaung, Taipei (TW); Jen-Cheng Liu, Hsin-Chu (TW); Jeng-Shyan Lin, Tainan (TW); Feng-Chi Hung, Chu-Bei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 157 days.

(21) Appl. No.: 13/592,124

(22) Filed: Aug. 22, 2012

(65) Prior Publication Data

US 2013/0307107 A1 Nov. 21, 2013

Related U.S. Application Data

(60) Provisional application No. 61/647,305, filed on May 15, 2012.

(51) Int. Cl.
 *H01L 21/00* (2006.01)
 *H01L 27/146* (2006.01)
(52) U.S. Cl.
 CPC ...... *H01L 27/1464* (2013.01); *H01L 27/14623* (2013.01)
 USPC .................................. 257/447; 257/E31.127

(58) Field of Classification Search
 CPC ..................... H01L 27/1464; H01L 27/14621; H01L 27/14623; H01L 27/14643
 See application file for complete search history.

(56) References Cited

U.S. PATENT DOCUMENTS

2007/0262354 A1 11/2007 Hsu et al.
2010/0038523 A1* 2/2010 Venezia et al. ................ 250/216
2010/0038740 A1* 2/2010 Fereyre ......................... 257/437

FOREIGN PATENT DOCUMENTS

KR 1020070109895 11/2007

OTHER PUBLICATIONS

John Compton, Color Filter Array 2.0, Jun. 14, 2007, http://johncompton.1000nerds.kodak.com/default.asp?item=624876, Captured on Jul. 20, 2007.*

* cited by examiner

*Primary Examiner* — Tucker Wright
(74) *Attorney, Agent, or Firm* — Slater & Matsil, L.L.P.

(57) ABSTRACT

A device includes a semiconductor substrate having a front side and a backside. A plurality of image sensors is disposed at the front side of the semiconductor substrate. A plurality of clear color-filters is disposed on the backside of the semiconductor substrate. A plurality of metal rings encircles the plurality of clear color-filters.

20 Claims, 12 Drawing Sheets

BSI IMAGE SENSOR CHIPS WITH SEPARATED COLOR FILTERS AND METHODS FOR FORMING THE SAME

This application claims the benefit of the following provisionally filed U.S. patent application: Application Ser. No. 61/647,305, filed May 15, 2012, and entitled "BSI Image Sensor Chips with Separated Color Filters and Methods for Forming the Same;" which application is hereby incorporated herein by reference.

BACKGROUND

Backside Illumination (BSI) image sensor chips are replacing front-side illumination sensor chips for their higher efficiency in capturing photons. In the formation of the BSI image sensor chips, image sensors, such as photo diodes, and logic circuits are formed on a silicon substrate of a wafer, followed by the formation of an interconnect structure on a front side of the silicon chip. The wafer is then thinned, and backside structures such as color filters and micro-lenses are formed on the backside.

The image sensors in the BSI image sensor chips generate electrical signals in response to the stimulation of photons. The magnitudes of the electrical signals (such as the currents) depend on the intensity of the incident light received by the respective image sensors. Conventional formation process of BSI image sensor chips suffer from optical cross-talks between the light received by different image sensors.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Backside Illumination (BSI) image sensor chip and the methods of forming the same are provided in accordance with various exemplary embodiments. The intermediate stages of forming color filters are illustrated. The variations of the embodiments are discussed. Throughout the various views and illustrative embodiments, like reference numbers are used to designate like elements.

Figure 1:
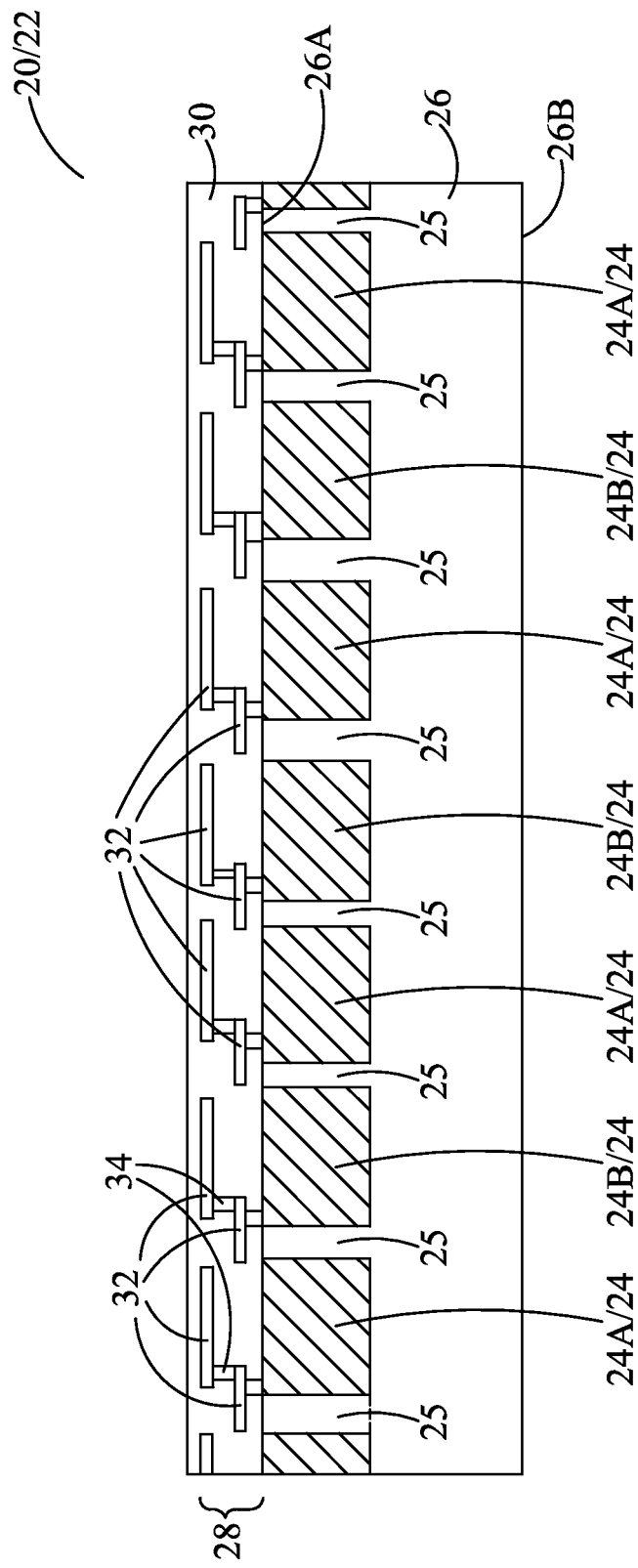
FIGS. 1 through 7 are cross-sectional views and top views of intermediate stages in the manufacturing of a Backside Illumination (BSI) image sensor chip in accordance with some exemplary embodiments.

FIGS. 1 through 7 illustrate the cross-sectional views and top views of intermediate stages in the manufacturing of a BSI chip in accordance with some exemplary embodiments. FIG. 1 illustrates image sensor chip 20, which is a part of wafer 22. Image sensor chip 20 includes semiconductor substrate 26. Semiconductor substrate 26 may be a crystalline silicon substrate or a semiconductor substrate formed of other semiconductor materials. Throughout the description, surface 26A is referred to a front surface of semiconductor substrate 26, and surface 26B is referred to as a back surface of semiconductor substrate 26. Image sensors 24 are disposed at the front surface of semiconductor substrate 26, for example, extending from front surface 26A into semiconductor substrate 26. Accordingly, the respective wafer 22 is an image sensor wafer. Image sensors 24 are configured to convert light signals (photons) to electrical signals. Image sensors 24 may be photo-sensitive Metal-Oxide-Semiconductor (MOS) transistors or photo-sensitive diodes. Image sensors 24 may form an image sensor array (please refer to FIG. 3B), and include image sensors 24A and 24B that are disposed in an alternating pattern in each row and each column of the image sensor array. Image sensors 24A and 24B, although referred to using different reference notations, are actually identical to each other. Image sensors 24 may be separated from each other by field implantation regions 25, which are the implanted portions of substrate 26.

Front-side interconnect structure 28 is formed over semiconductor substrate 26, and is used to electrically interconnect the devices in image sensor chip 20. Front-side interconnect structure 28 includes dielectric layers 30, and metal lines 32 and vias 34 in dielectric layers 30. Throughout the description, the metal lines 32 in a same dielectric layer 30 are collectively referred to as being a metal layer. Front-side interconnect structure 28 may include a plurality of metal layers. In some exemplary embodiments, dielectric layers 30 include low-k dielectric layers and passivation layers. The low-k dielectric layers have low k values, for example, lower than about 3.0. The passivation layers may be formed of non-low-k dielectric materials having k values greater than 3.9. In some embodiments, the passivation layers include a silicon oxide layer and a silicon nitride layer on the silicon oxide layer.

Figure 2:
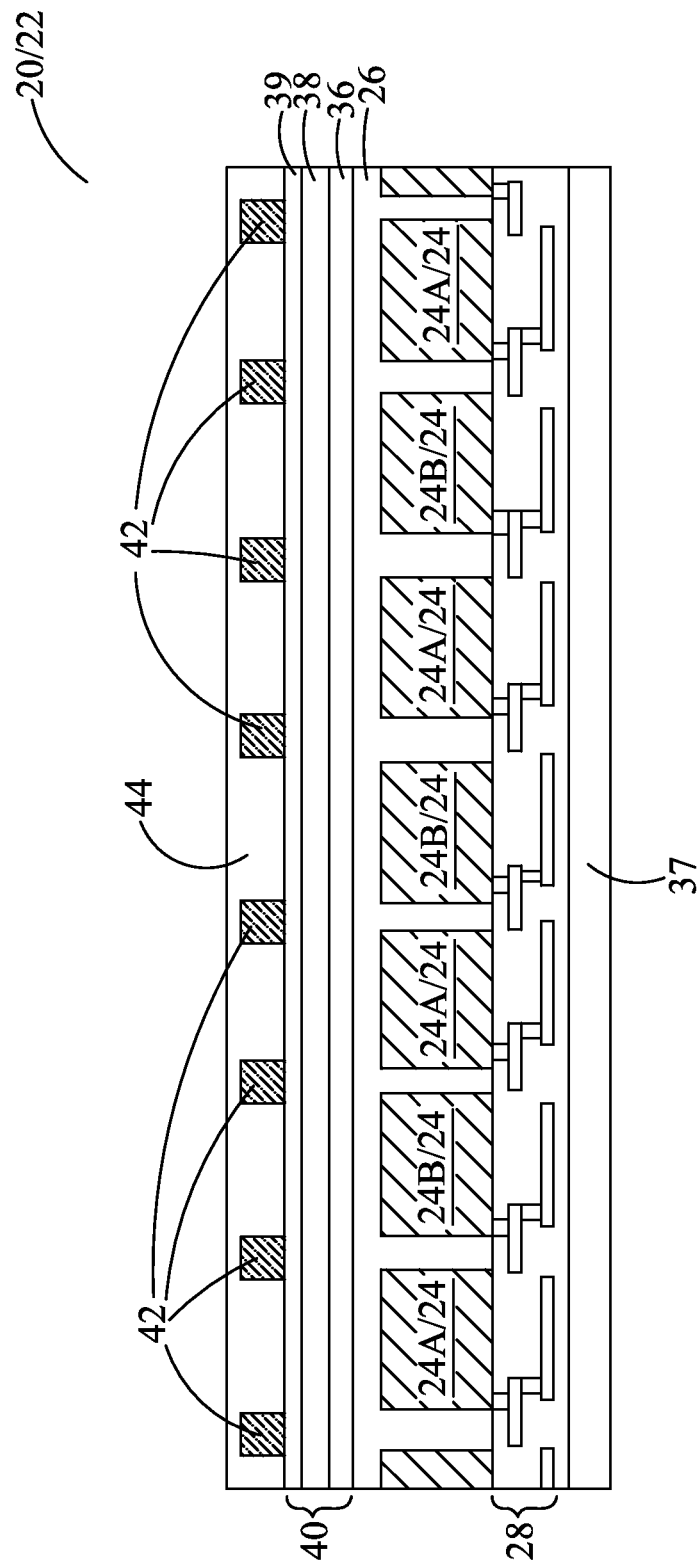

Referring to FIG. 2, carrier 37 is bonded to the front side of wafer 22, for example, through an oxide-to-oxide bonding. A backside grinding is performed to thin semiconductor substrate 26, and the thickness of wafer 22 is reduced. With semiconductor substrate 26 having a small thickness, light can penetrate from back surface 26B into semiconductor substrate 26, and reach image sensors 24.

After the step of thinning, buffer layers 40 (also sometimes referred to as upper layers) are formed on the back surface of semiconductor substrate 26. In some exemplary embodiments, buffer layers 40 include one or more of Bottom Anti-Reflective Coating (BARC) 36, silicon oxide layer 38, and silicon nitride layer 39. Silicon oxide layer 38 may be formed using Plasma Enhanced Chemical Vapor Deposition (PECVD), and hence is referred to as Plasma Enhanced (PE) oxide layer 38. It is appreciated that buffer layers 40 may have different structures, formed of different materials, and/or have different number of layers other than illustrated.

Metal grid 42 is formed over upper layers 40. Metal grid 42 may be formed of a metal or a metal alloy comprising tungsten, aluminum, copper, or combinations thereof. Metal grid has the shape of a grid in the top view of the structure shown in FIG. 2, wherein image sensors 24 are aligned to the grid openings of metal grid 42. Dielectric layer 44 is filled into the grid openings of metal grid 42. In some embodiments, dielectric layer 44 comprises silicon oxide. The top surface of dielectric layer 44 is leveled, and may be higher than the top surface of metal grid 42.

Figure 3A:
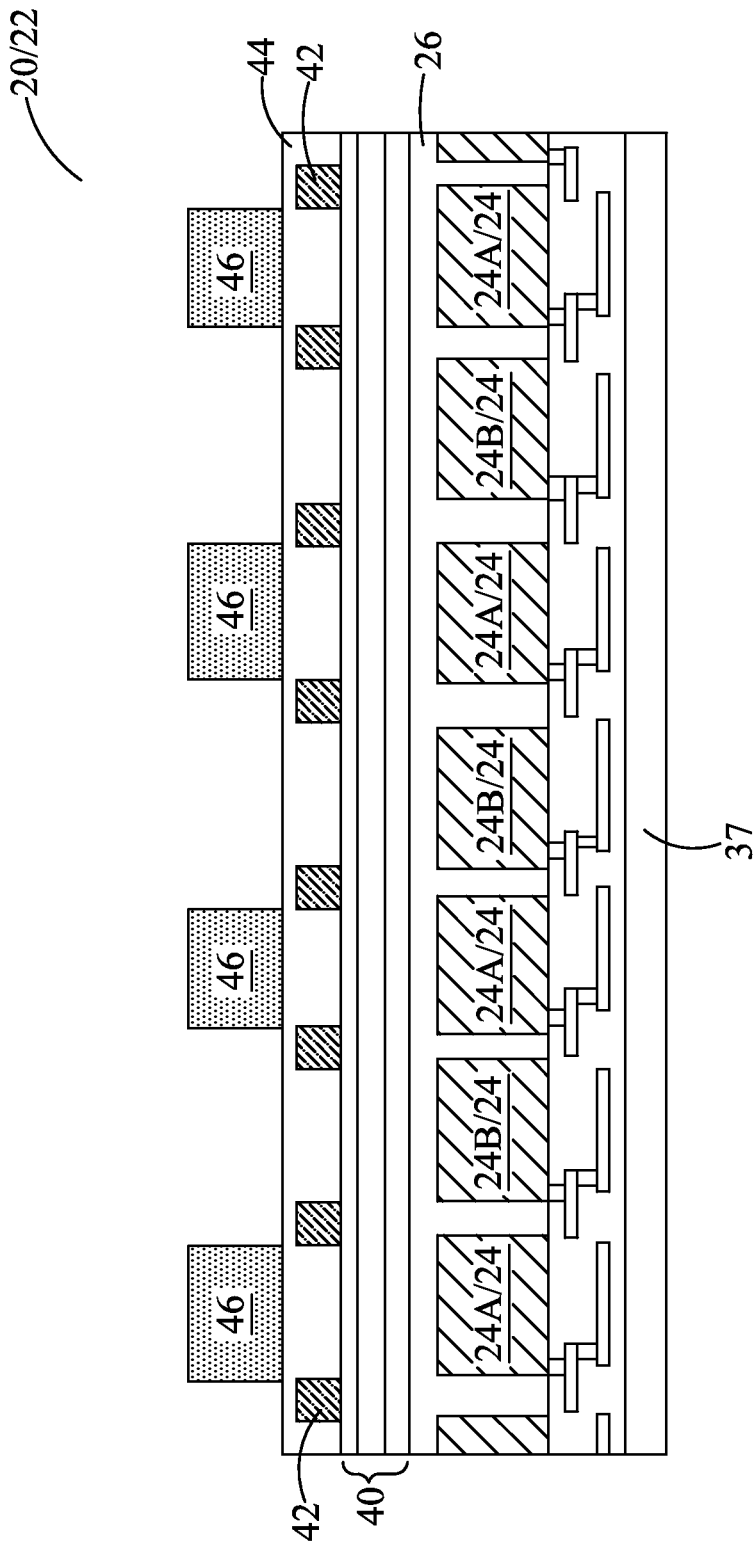
Figure 3B:
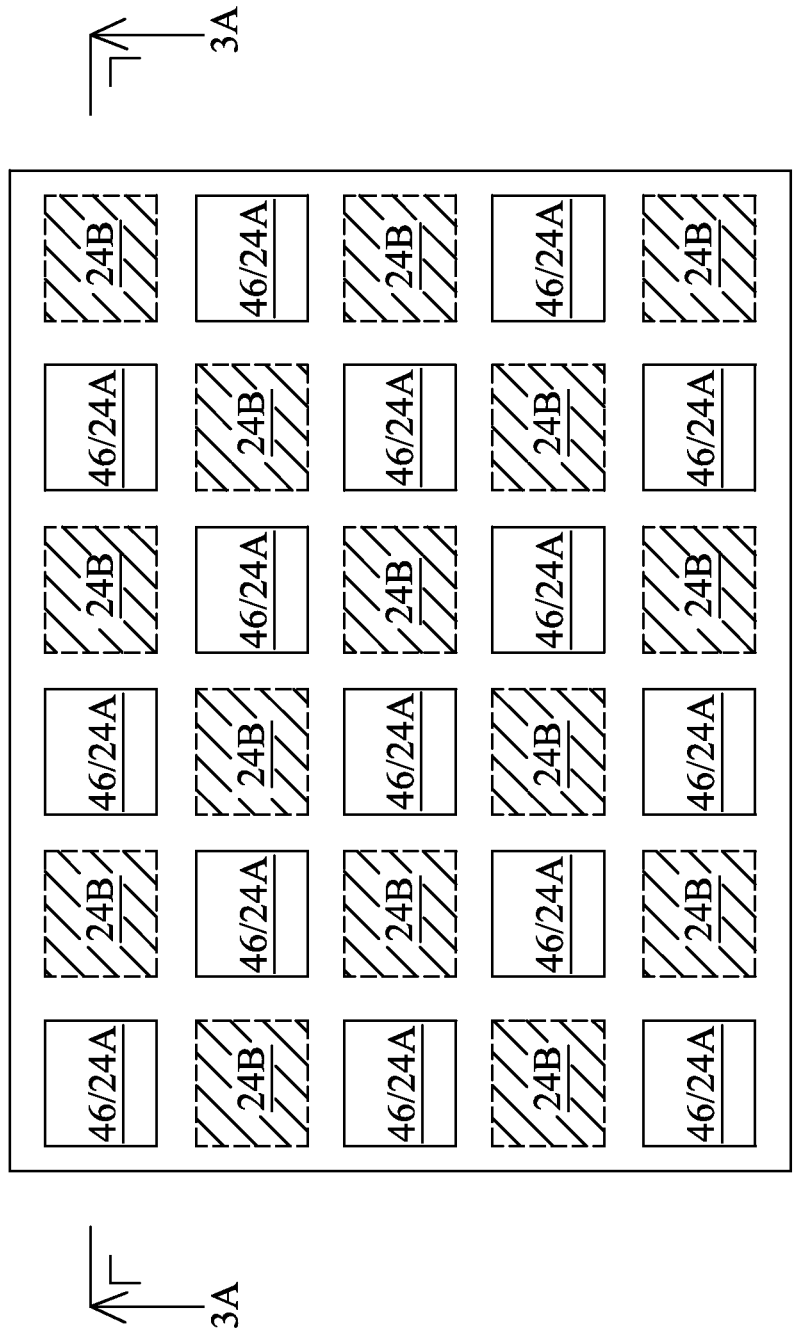

Referring to FIGS. 3A and 3B, a transparent material is deposited and then patterned to form clear color-filters 46. Each of clear color-filters 46 overlaps one of image sensors 24A with a one-to-one correspondence, for example, with each of image sensors 24A underlying and aligned to one of clear color-filters 46, and each of clear color-filters 46 overlapping one of FIG. 3A illustrates a cross-sectional view.

Color-filters 46 are formed of a transparent material that is transparent to visible light, for example, the lights having the wavelengths in the range between about 400 nm and about 700 nm. Accordingly, clear color-filters 46 allow substantially all colors in the visible-light spectrum to pass through. Clear color-filters 46 have a low reflective index n, which may be smaller than about 2.0. Exemplary materials for forming clear color-filters 46 include, and are not limited to, oxides such as silicon oxide, silicon nitride, silicon carbide, low-k (low dielectric constant) materials, or the like. The formation methods may include, for example, a Chemical Vapor Deposition (CVD) method such as PECVD.

FIG. 3B illustrates a top view of the structure shown in FIG. 3A, wherein the cross-sectional view in FIG. 3A is obtained from the plane crossing line 3A-3A in FIG. 3B. In some embodiments, clear color-filters 46 are arranged as a checkerboard layout, wherein clear color-filters 46 have the layout of either the black color or the white color of a checkerboard. Clear color-filters 46 overlap image sensors 24A, and do not overlap image sensors 24B. Between each pair of neighboring clear color-filters 46, there is a space/gap overlapping one of image sensors 24B.

Figure 4:
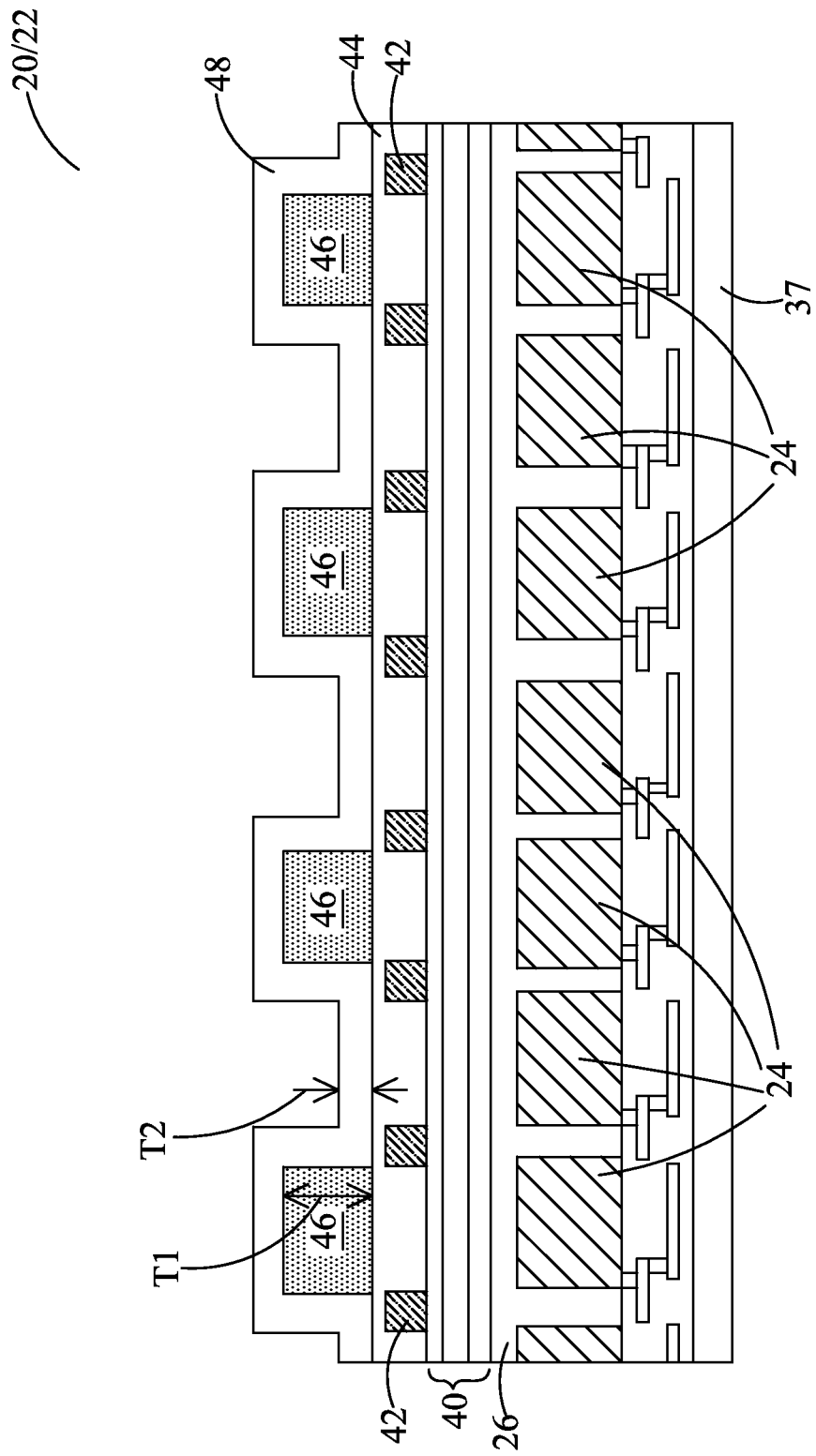

Referring to FIG. 4, metal layer 48 is deposited on the top surfaces and sidewalls of clear color-filters 46. Metal layer 48 is also deposited into the space between neighboring clear color-filters 46. In some embodiments, metal layer 48 includes a metal(s) or a metal alloy, wherein the metals in metal layer 48 may include tungsten, aluminum, silver, copper, and/or the like. Thickness T2 of metal layer 48 is smaller than thickness T1 of clear color-filters 46, and may further be smaller than about 10 percent thickness T1. In some embodiments, thickness T2 is between about 500 Å and about 2,000 Å. Metal layer 48 may be deposited using a conformal deposition method such as Physical Vapor Deposition (PVD), Electrical Chemical Plating (ECP), or the like. Accordingly, the thickness of the vertical portions of metal layer 48, which vertical portions are on the sidewalls of clear color-filters 46, is close to the thickness of the horizontal portions over clear color-filters 46. For example, the thickness of the vertical portions of metal layer 48 may be greater than about 70 percent, 80 percent, or 90 percent of the thickness of the horizontal portions of metal layer 48.

Figure 5A:
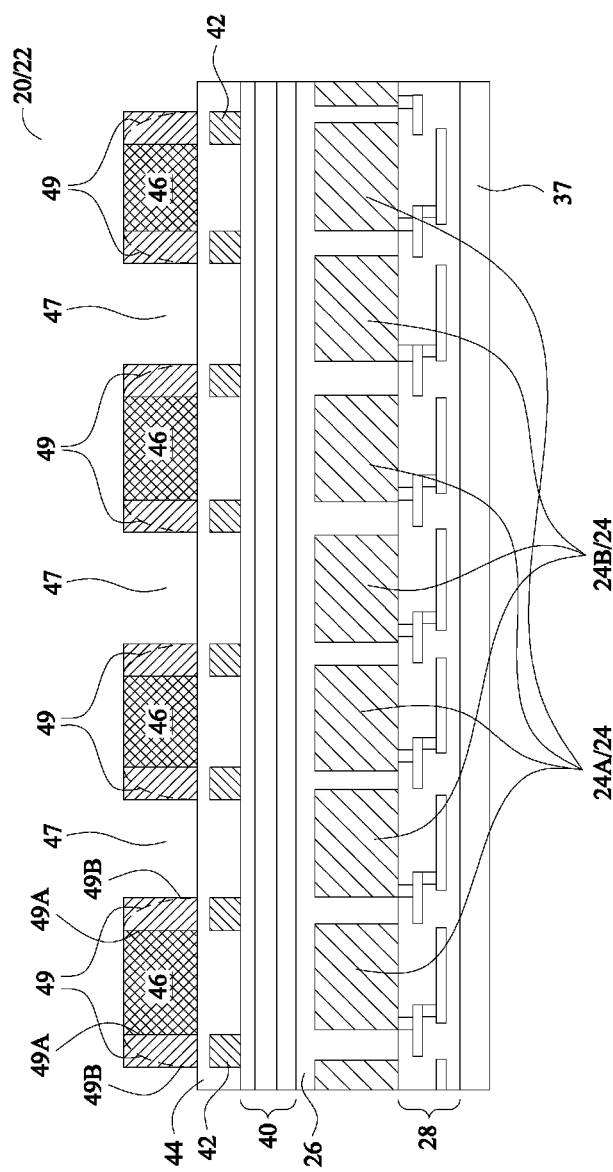
Figure 5B:
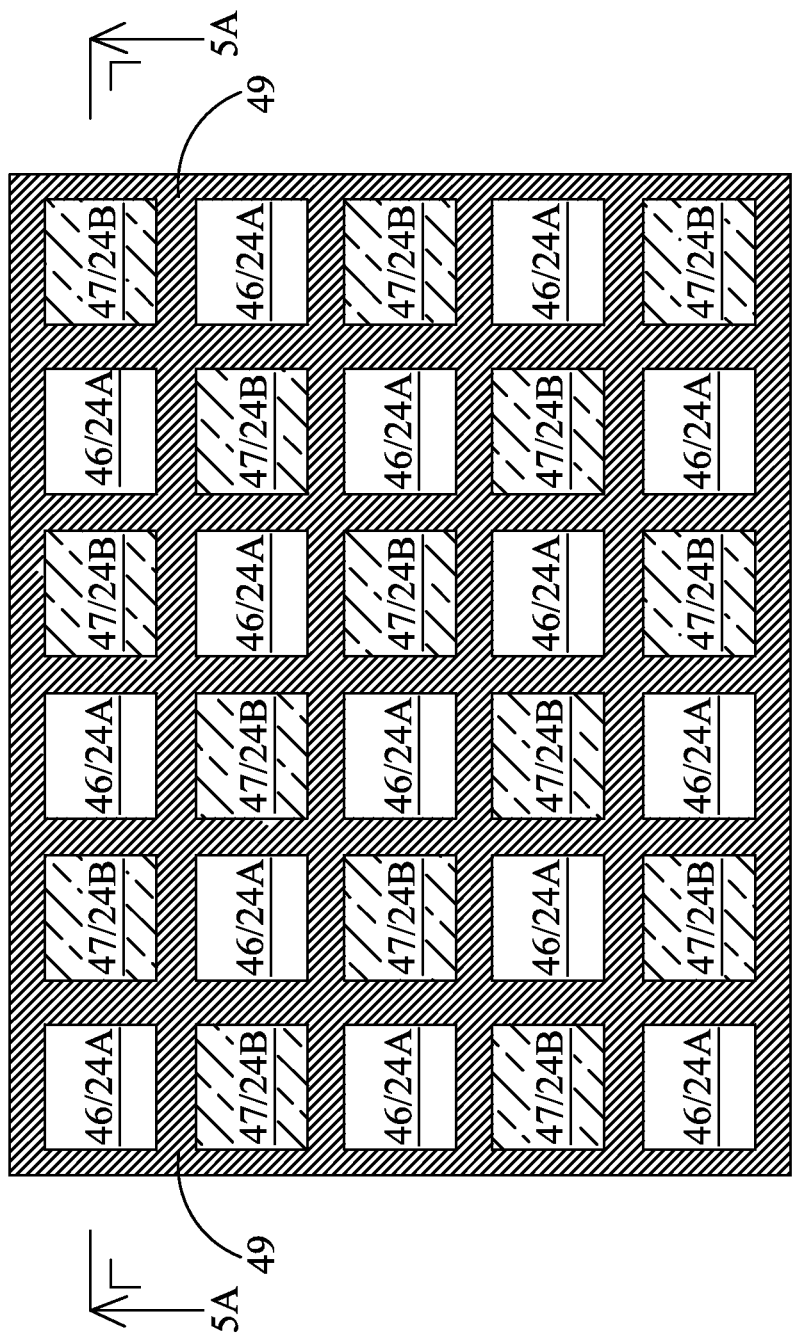

Metal layer 48 is etched using an anisotropic etching method such as dry etching. The resulting structure is shown in FIGS. 5A and 5B. FIG. 5A illustrates a cross-sectional view. As shown in FIG. 5A, the horizontal portions of metal layer 48, which horizontal portions include portions on the top surfaces of clear color-filters 46 and the portions on buffer layers 40, are removed. Some sidewall portions of metal layer 48 remain un-etched after the etching step, and are referred to as metal rings 49 hereinafter. After the etching step, metal rings 49 are spaced apart from each other by unfilled spaces 47. Furthermore, metal rings 49 encircle color-filters 46. As a result of the etching process, metal rings 49 have sidewalls 49A adjoining clear color-filters 46, and sidewalls 49B opposite to the respective sidewalls 49A. The profile of sidewalls 49A is determined by the profile of the sidewalls of clear color-filters 46, and may be substantially vertical. On the other hand, the profile of sidewalls 49B is affected by the etching process. For example, sidewalls 49B may be sloped, as shown by the dashed lines, with the heights of the portions of sidewalls 49B closer to clear color-filters 46 being higher than the heights of the portions of sidewalls 49B farther away from clear color-filters 46. Furthermore, as shown by the dashed lines, the heights of a sidewall 49B may gradually and continuously reduce from regions close to clear color-filters 46 to regions away from clear color-filters 46.

Figure 5C:
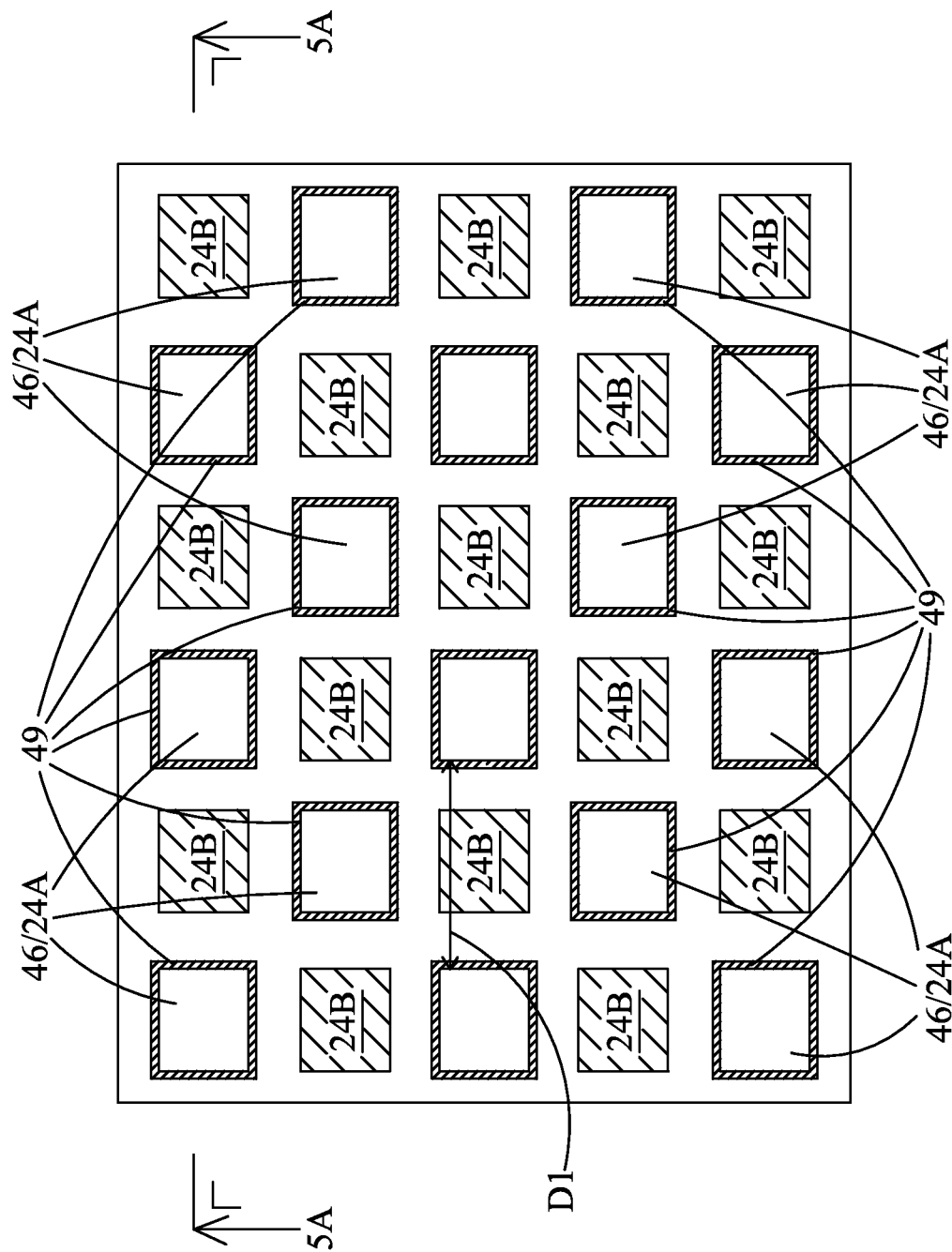

FIGS. 5B and 5C are top views of the structure shown in FIG. 5A in accordance with various exemplary embodiments. The cross-sectional view in FIG. 5A is either obtained from the plane crossing line 5A-5A in FIG. 5B, or from the plane crossing line 5A-5A in FIG. 5C. It is appreciated that although FIGS. 5B and 5C illustrate different structures, their cross-sectional views may be the same, as shown in FIG. 5A. In some exemplary embodiments, as shown in FIG. 5B, metal rings 49 are interconnected to form a metal grid. Metal rings 49 in accordance these embodiments are hence collectively referred to as metal grid 49 hereinafter. In each row and each column of the grid openings in metal grid 49, clear color-filters 46 and spaces 47 are arranged in an alternating pattern.

In alternative embodiments, as shown FIG. 5C, metal rings 49 are disconnected from each other. Each of metal rings 49 forms a ring encircling one of clear color-filters 46, and the rings are separated from each other. The embodiments in FIGS. 5B and 5C may be achieved by adjusting distance D1 between neighboring clear color-filters 46 and thickness T2 of metal layer 48 (FIG. 4).

Figure 6A:
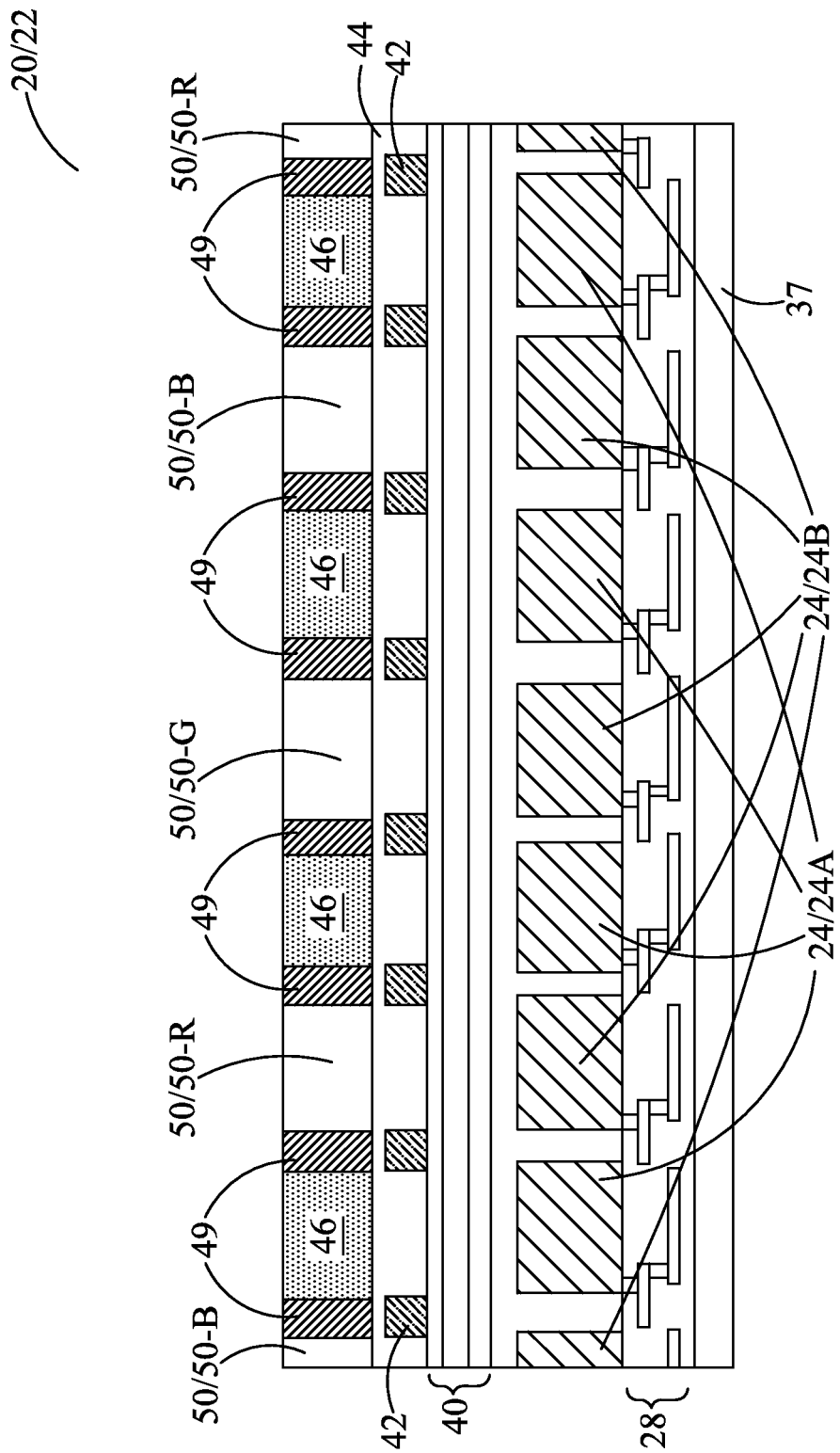
Figure 6B:
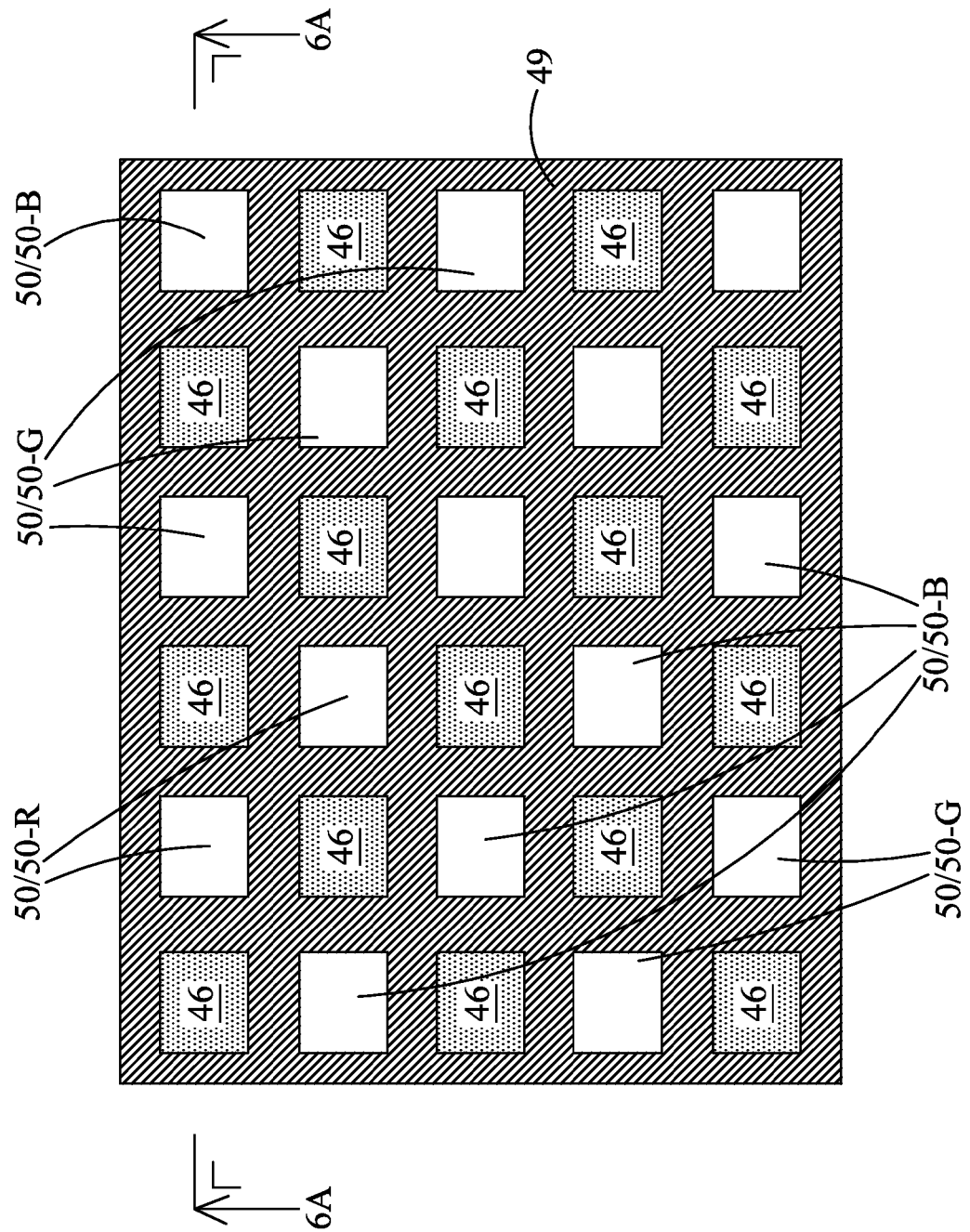
Figure 6C:
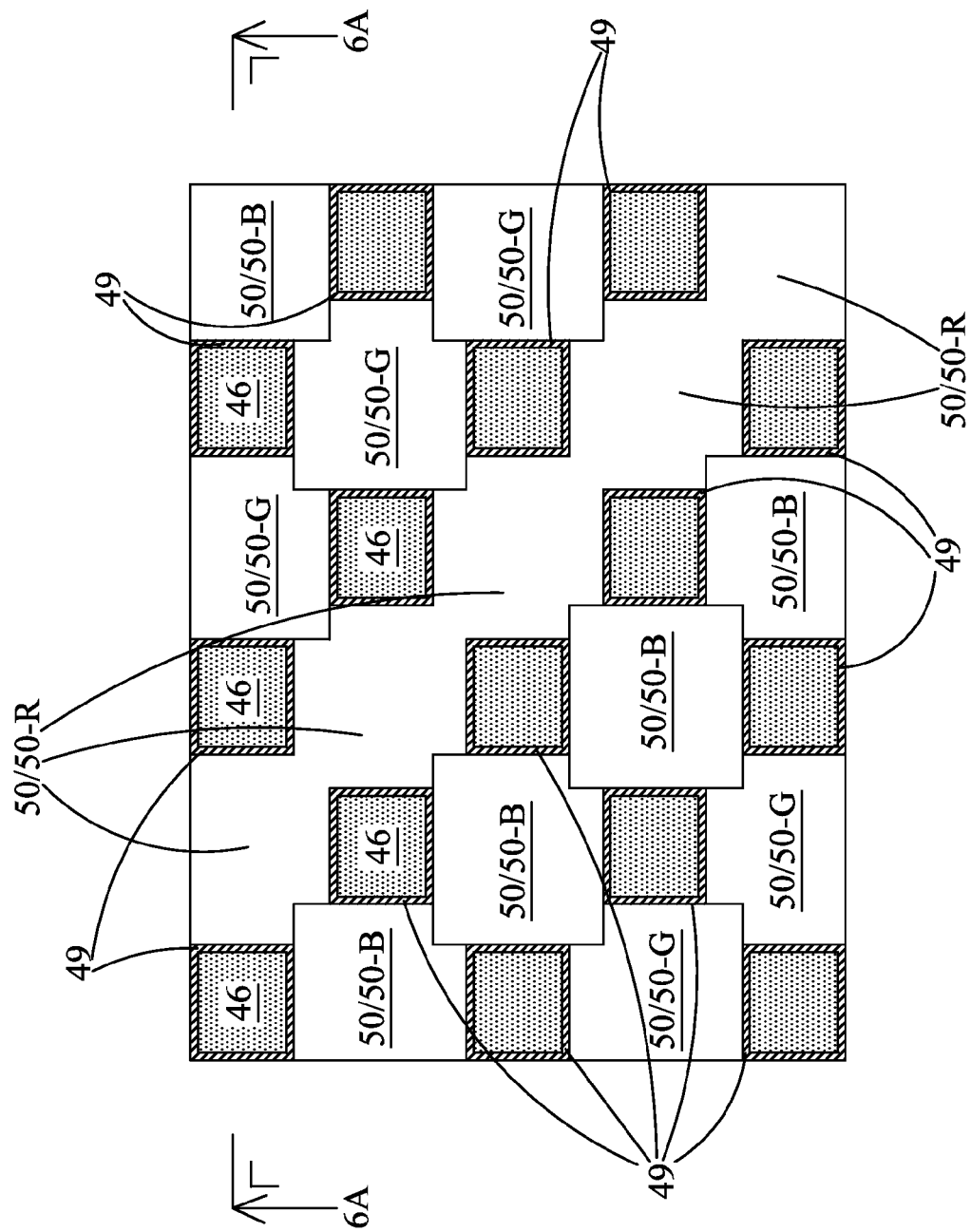

FIG. 6A and FIGS. 6B and 6C illustrate a top view and cross-sectional views, respectively, in the formation of color filters 50. In some embodiments, color filters 50 include red color-filters 50-R, green color-filters 50-G, and blue color-filters 50-B. accordingly; color filters 50 are alternatively referred to as colored color-filters hereinafter. Red color-filters 50-R, green color-filters 50-G, and blue color-filters 50-B may be formed of polymers, which are configured to allow the red light, the green light, and the blue light, respectively, to pass through. The formation process for each of color filters 50 may include a deposition step and an etching step.

FIG. 6B illustrates an exemplary top view of the structure shown in FIG. 6A, wherein the cross-sectional view in FIG. 6A is obtained from the plane crossing line 6A-6A in FIG. 6B. It is observed that in each row and each column of the grids defined by metal grid 49, clear color-filters 46 and colored color-filters 50 are arranged in an alternating pattern. Furthermore, colored color-filters 50-R, 50-G, and 50-B are allocated in a repeated pattern in each row and each column of the array formed of color filters 46 and 50. In FIG. 6B, each of clear color-filters 46 is encircled by a portion of metal rings 49, and metal rings 49 are interconnected to form the metal grid. Color filters 50-R, 50-G, and 50-B are hence separated from each other by metal grid 49.

FIG. 6C illustrates a top view of the structure shown in FIG. 6A in accordance with alternative embodiments, wherein the cross-sectional view in FIG. 6A is also obtained from the plane crossing line 6A-6A in FIG. 6C. In FIG. 6C, each of clear color-filters 46 is encircled by one of metal rings 49, which metal rings 49 are separated from each other. Each of clear color-filters 46 is spaced apart from remaining ones of the colored color-filters 50-R, 50-G, and 50-B by one of metal rings 49. Colored color-filters 50-R, 50-G, and 50-B, on the other hand, may contact with each other.

Figure 7:
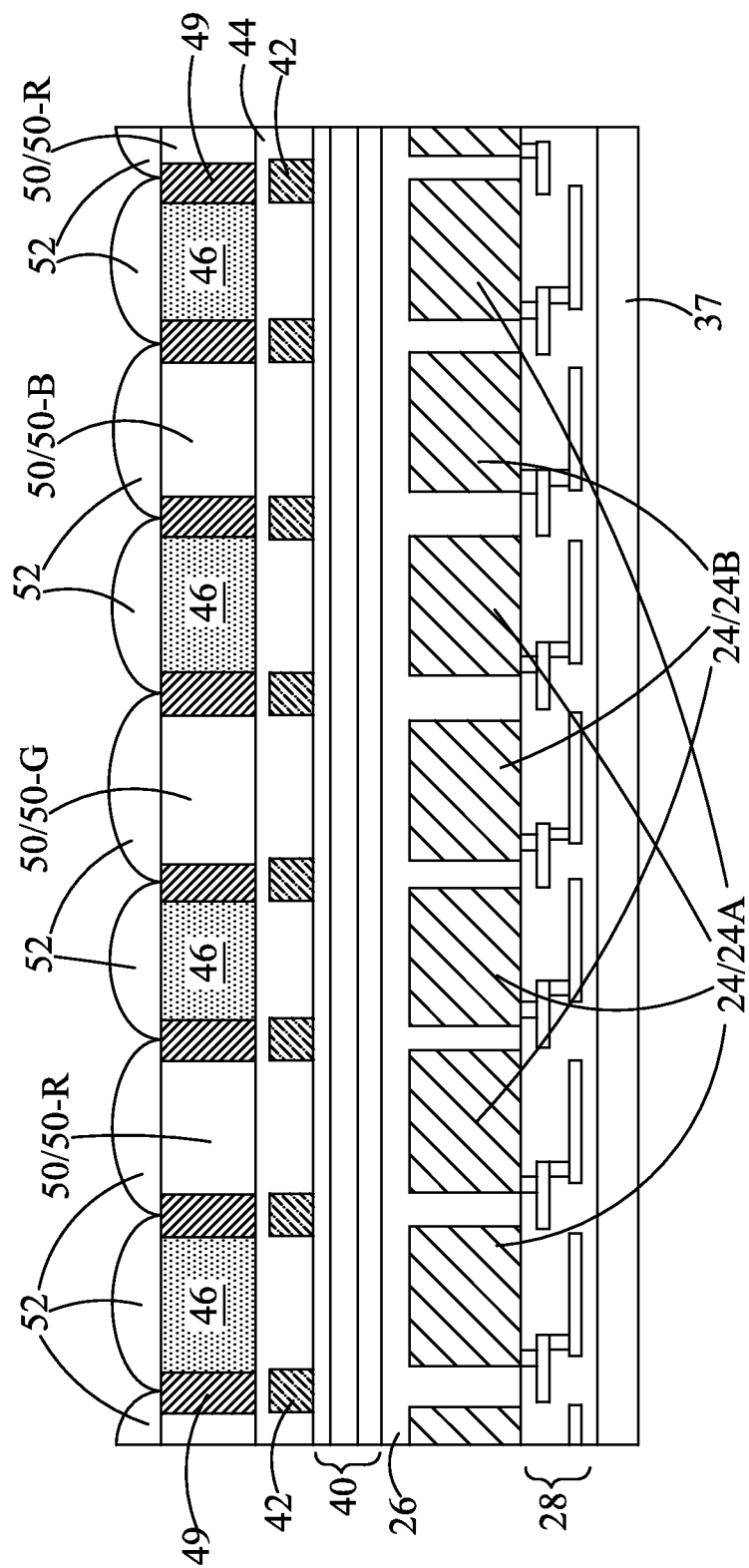

In subsequent process steps, as shown in FIG. 7, additional components such as micro-lenses 52 are formed, with each of color filters 46/50 and micro-lenses 56 overlapping one of image sensors 24.

In the structure shown in FIG. 7, it is observed that metal rings 49 separate clear color-filters 46 from colored color-filters 50-R, 50-G, and 50-B. Since clear color-filters 46 have a refractive index n lower than the refractive index of colored color-filters 50-R, 50-G, and 50-B, if metal grid 49 is not formed, there exists the cross-talk from clear color-filters 46 into colored color-filters 50-R, 50-G, and 50-B. In the embodiments, however, metal rings 49 blocks and reflects the light that otherwise would travel from clear color-filters 46 into colored color-filters 50-R, 50-G, and 50-B.

In accordance with embodiments, a device includes a semiconductor substrate having a front side and a backside. A plurality of image sensors is disposed at the front side of the semiconductor substrate. A plurality of clear color-filters is disposed on the backside of the semiconductor substrate. A plurality of metal rings encircles the plurality of clear color-filters.

In accordance with other embodiments, a device includes a semiconductor substrate having a front side and a backside, and a plurality of image sensors disposed at the front side of the semiconductor substrate, wherein the plurality of image sensors forms an array. A plurality of clear color-filters is disposed on the backside of the semiconductor substrate and over the semiconductor substrate, wherein each of the clear color-filters overlaps one of the plurality of image sensors. A plurality of metal rings is disposed on the backside of the semiconductor substrate, each encircling one of the plurality of clear color-filters. A plurality of colored color-filters includes red color-filters, green color-filters, and blue color-filters, wherein each of the colored color-filters overlaps one of the plurality of image sensors.

In accordance with yet other embodiments, a method includes forming a plurality of image sensors on a front side of a semiconductor substrate, and forming a transparent layer on a backside of the semiconductor substrate, wherein the transparent layer is over the semiconductor substrate. The method further includes patterning the transparent layer into a plurality of clear color-filters, wherein each of the plurality of clear color-filters overlaps one of the plurality of image sensors. A metal layer is formed on top surfaces and sidewalls of the plurality of clear color-filters. The metal layer is etched to remove horizontal portions of the metal layer, wherein vertical portions of the metal layer remain after the step of etching to form metal rings. Colored color-filters are filled into spaces between the metal rings.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate having a front side and a backside;
    a plurality of image sensors disposed at the front side of the semiconductor substrate;
    a plurality of clear color-filters and a plurality of colored color-filters on the backside of the semiconductor substrate; and
    a plurality of metal rings, each encircling one of the plurality of clear color-filters, wherein each of the plurality of metal rings comprises:
        first edges contacting the respective encircled one of the clear color-filters, wherein the first edges are substantially vertical; and
        second edges contacting colored color-filters, wherein the second edges are sloped, with portions of the second edges closer to the clear color-filters being higher than portions of the second edges closer to the colored color-filters.

2. The device of claim 1, wherein the plurality of metal rings are interconnected to form a metal grid, and wherein the plurality of colored color-filters is disposed in grid openings of the metal grid.

3. The device of claim 1, wherein the plurality of metal rings are spaced apart from each other, and wherein the plurality of colored color-filters is disposed in spaces between the plurality of metal rings.

4. The device of claim 3, wherein the plurality of colored color-filters comprises red color-filters, green color-filters, and blue color-filters, and wherein the red color-filters are in contact with the green color-filters and the blue color-filters.

5. The device of claim 1, wherein each of the clear color-filters overlaps one of the plurality of image sensors.

6. The device of claim 1, wherein the plurality of metal rings comprises a metal selected from the group consisting essentially of tungsten, aluminum, silver, copper, and combinations thereof.

7. A device comprising:
    a semiconductor substrate having a front side and a backside;
    a plurality of image sensors disposed at the front side of the semiconductor substrate, wherein the plurality of image sensors forms an array;
    a plurality of clear color-filters on the backside of the semiconductor substrate and over the semiconductor substrate, wherein each of the clear color-filters overlaps one of the plurality of image sensors;
    a plurality of metal rings, each encircling one of the plurality of clear color-filters; and
    a plurality of colored color-filters comprising red color-filters, green color-filters, and blue color-filters, wherein each of the colored color-filters overlaps one of the plurality of image sensors, wherein each of the plurality of metal rings comprises:
        first edges contacting the clear color-filters, wherein the first edges are substantially vertical; and
        second edges contacting the colored color-filters, wherein the second edges are sloped, with portions of the second edges closer to the clear color-filters being higher than portions of the second edges closer to the colored color-filters.

8. The device of claim 7, wherein the plurality of metal rings are spaced apart from each other, and wherein spaces between the plurality of metal rings are filled with the plurality of colored color-filters.

9. The device of claim 7, wherein the plurality of metal rings are interconnected to form a metal grid, and wherein each of the colored color-filters is disposed in one grid opening of the metal grid.

10. The device of claim 9 further comprising an additional metal grid underlying the metal grid, and between the metal grid and the semiconductor substrate.

11. The device of claim 7, wherein the plurality of metal rings comprises a metal selected from the group consisting essentially of tungsten, aluminum, silver, copper, and combinations thereof.

12. A device comprising: a semiconductor substrate; a plurality of image sensors disposed in the semiconductor substrate; a plurality of colored color-filters aligned to the plurality of image sensors; a plurality of clear color-filters aligned to the plurality of image sensors; and a plurality of metal features separating the plurality of colored color-filters and the plurality of clear color-filters from each other, wherein each of the plurality of metal features comprises: first edges wherein the first edges are substantially vertical; and second edges opposite to respective first edges, wherein the second edges are sloped.

13. The device of claim 12, wherein the plurality of colored color-filters comprises a plurality of red color-filters, a plurality of green color-filters, and a plurality of blue color-filters.

14. The device of claim 13, wherein each of the plurality of red color-filters comprises a first edge in contact with an edge of one of the plurality of green color-filters, and a second edge in contact with an edge of one of the plurality of blue color-filters.

15. The device of claim 13, wherein each of the plurality of red color-filters, the plurality of green color-filters, and the plurality of blue color-filters is encircled by one of the plurality of metal features.

16. The device of claim 12, wherein each of the plurality of clear color-filters is encircled by one of the plurality of metal features.

17. The device of claim 12, wherein the plurality of metal features is interconnected to form a metal grid, with the plurality of color-filters inside grid openings of the grid.

18. The device of claim 12, wherein the plurality of metal features comprises tungsten, aluminum, or copper.

19. The device of claim 12, wherein the first edges are in contact with the clear color-filters, and the second edges are in contact with the colored color-filters.

20. The device of claim 19, wherein portions of the second edges closer to the clear color-filters are higher than portions of the second edges closer to the colored color-filters.

\* \* \* \* \*